(12) United States Patent
Pandey et al.

(10) Patent No.: US 9,947,788 B2
(45) Date of Patent: Apr. 17, 2018

(54) DEVICE WITH DIFFUSION BLOCKING LAYER IN SOURCE/DRAIN REGION

(71) Applicant: GLOBALFOUNDRIES Inc., Grand Cayman (KY)

(72) Inventors: Shesh Mani Pandey, Saratoga Springs, NY (US); Pei Zhao, Clifton Park, NY (US); Baofu Zhu, Clifton Park, NY (US); Francis L. Benistant, Singapore (SG)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/019,273

(22) Filed: Feb. 9, 2016

(65) Prior Publication Data
US 2017/0229578 A1  Aug. 10, 2017

(51) Int. Cl.
*H01L 29/78* (2006.01)
*H01L 29/08* (2006.01)
*H01L 29/16* (2006.01)
*H01L 29/165* (2006.01)
*H01L 29/66* (2006.01)

(52) U.S. Cl.
CPC ...... *H01L 29/7848* (2013.01); *H01L 29/0847* (2013.01); *H01L 29/165* (2013.01); *H01L 29/1608* (2013.01); *H01L 29/66636* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 2014/0287564 A1* | 9/2014 | Park | H01L 29/0847 438/285 |
| 2015/0031183 A1* | 1/2015 | Kang | H01L 21/0245 438/285 |
| 2015/0221768 A1* | 8/2015 | Zhong | H01L 29/401 257/402 |
| 2015/0372142 A1* | 12/2015 | Kuang | H01L 29/7848 257/192 |
| 2016/0322474 A1* | 11/2016 | Tsai | H01L 29/66636 |

OTHER PUBLICATIONS

First Taiwanese Examination Report dated Dec. 19, 2017, for Taiwanese patent application No. 105138840 filed Nov. 25, 2016.

* cited by examiner

*Primary Examiner* — Ali Naraghi
(74) *Attorney, Agent, or Firm* — Amerson Law Firm, PLLC

(57) ABSTRACT

A method includes forming a gate electrode structure above a channel region defined in a semiconductor material. The semiconductor material is recessed in a source/drain region. A first material is epitaxially grown in the source/drain region. The first material includes a dopant species having a first concentration. A diffusion blocking layer is formed in the source/drain region above the first material. A second material is epitaxially grown in the source/drain region above the diffusion blocking layer. The second material comprises the dopant species having a second concentration greater than the first concentration.

18 Claims, 7 Drawing Sheets

DEVICE WITH DIFFUSION BLOCKING LAYER IN SOURCE/DRAIN REGION

BACKGROUND OF THE INVENTION

1. Field of the Invention

The present disclosure generally relates to the fabrication of semiconductor devices, and, more particularly, to a device with a diffusion blocking layer in a source/drain region.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a three-dimensional structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

Device designers have recently employed channel stress engineering techniques on FETs to improve the electrical performance of such devices, i.e., to improve the mobility of the charge carriers. More specifically, such stress engineering techniques generally involve creating a compressive stress in the channel region for a PMOS transistor. In general, stress engineering techniques for finFETs have generally involved forming stress-inducing layers of material over or within the source and drain regions of the FinFET. As noted above, a FinFET is a three-dimensional device where stress engineering techniques may be very complex to implement. For NMOS transistors, stressed materials are typically not used. Instead, the performance profile for NMOS devices is generally achieved by junction doping. However, it is difficult to increase the activated dopant levels without introducing degradation from an increase in short channel effects.

FIG. 1 is a perspective view of an illustrative prior art integrated circuit product 100 that is formed above a semiconductor substrate 105. In this example, the product 100 includes five illustrative fins 110, 115, a shared gate structure 120, a sidewall spacer 125, and a gate cap 130. The product 100 implements two different FinFET transistor devices (N-type and P-type) with a shared gate structure. The gate structure 120 is typically comprised of a layer of insulating material (not separately shown), e.g., a layer of high-k insulating material or silicon dioxide, and one or more conductive material layers (e.g., metal and/or polysilicon) that serve as the gate electrode for the transistors on the product 100. The fins 110, 115 have a three-dimensional configuration. The portions of the fins 110, 115 covered by the gate structure 120 define the channel regions of the FinFET transistor devices on the product 100. An isolation structure 135 is formed between the fins 110, 115. The fins 110 are associated with a transistor device of a first type (e.g., N-type), and the fins 115 are associated with a transistor device of a complementary type (e.g., P-type). The gate structure 120 is shared by the N-type and P-type transistors, a common configuration for memory products, such as static random access memory (SRAM) cells.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method includes forming a gate electrode structure above a channel region defined in a semiconductor material. The semiconductor material is recessed in a source/drain region. A first material is epitaxially grown in the source/drain region. The first material includes a dopant species having a first concentration. A diffusion blocking layer is formed in the source/drain region above the first material. A second material is epitaxially grown in the source/drain region above the diffusion blocking layer. The second material comprises the dopant species having a second concentration greater than the first concentration.

Another method includes forming a fin on a semiconductor substrate. A gate electrode structure is formed above the fin in a channel region. The fin is recessed in a source/drain region. A first semiconductor material is epitaxially grown in the source/drain region. The first semiconductor material includes a dopant species having a first concentration. A silicon alloy layer is epitaxially grown in the source/drain region above the first semiconductor material. A second semiconductor material is epitaxially grown in the source/drain region above the silicon alloy layer. The second semiconductor material comprises the dopant species having a second concentration greater than the first dopant concentration.

One illustrative device disclosed herein includes, among other things, a fin defined on a substrate. A gate electrode structure is positioned above the fin in a channel region. A source/drain region is defined in the fin. The source/drain region includes a first epitaxial semiconductor material. The first epitaxial semiconductor material includes a dopant species having a first concentration. A diffusion blocking layer is positioned above the first semiconductor material. A second epitaxial semiconductor material is positioned above the diffusion blocking layer. The second epitaxial semiconductor material includes the dopant species having a second concentration greater than the first dopant concentration.

BRIEF DESCRIPTION OF THE DRAWINGS

The disclosure may be understood by reference to the following description taken in conjunction with the accompanying drawings, in which like reference numerals identify like elements, and in which.

Figure 1:
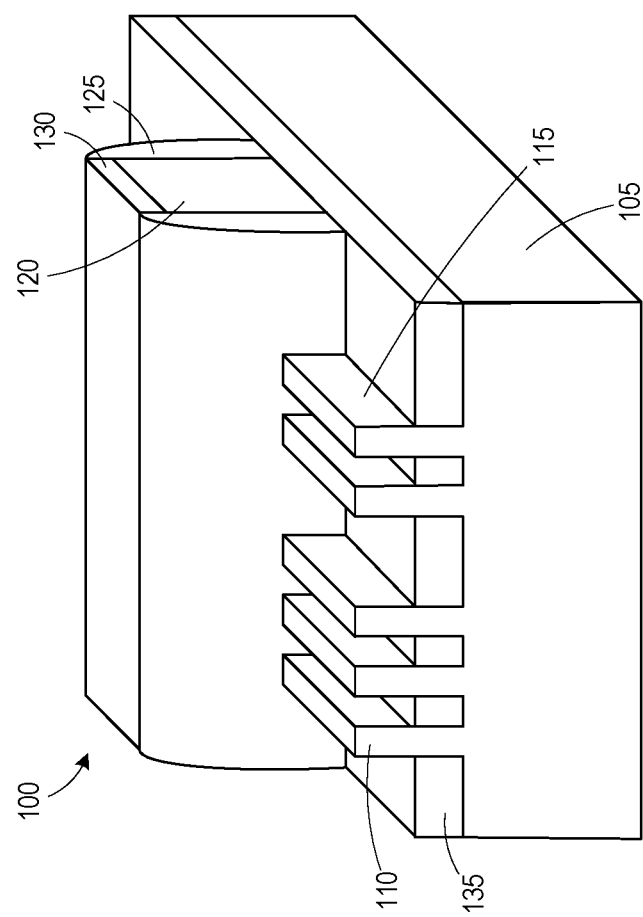
FIG. 1 schematically depicts an illustrative prior art finFET device.
Figure 2A:
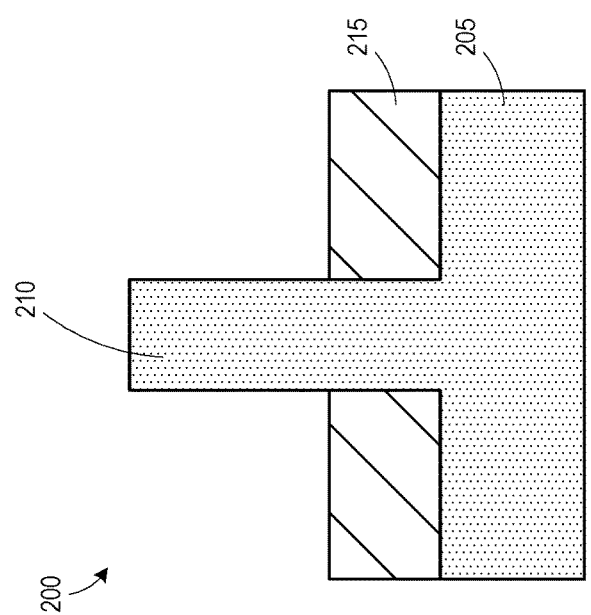

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a finFET device with a silicon alloy layer in a source/drain region of the device. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 2A-2F and 3A-3F illustrate various methods for forming a finFET device 200. In the illustrated embodiment, the device 200 will be an N-type transistor device. FIGS. 2A-2F show a cross-sectional view (in the gate width direction of the device 200) of a substrate 205 with a fin 210 defined therein and isolation structures 215 formed adjacent the fin 210 to isolate the fin 210 from adjacent fins (not shown). FIGS. 3A-3F illustrate a cross-sectional view of the device 200 taken through the fin 210 in a direction corresponding to the gate length direction of the device 200 (rotated 90 degrees with respect to the view of FIGS. 2A-2F).

The substrate 205 may have a variety of configurations, such as the depicted bulk silicon configuration. The substrate 205 may also have a silicon-on-insulator (SOI) configuration that includes a bulk silicon layer, a buried insulation layer and an active layer, wherein semiconductor devices are formed in and above the active layer. The substrate 205 may be formed of silicon or silicon germanium or it may be made of materials other than silicon, such as germanium. Thus, the terms "substrate" or "semiconductor substrate" should be understood to cover all semiconducting materials and all forms of such materials. The substrate 205 may have different layers. For example, the fin 210 may be formed in a process layer formed above the base layer of the substrate 205.

Figure 3A:
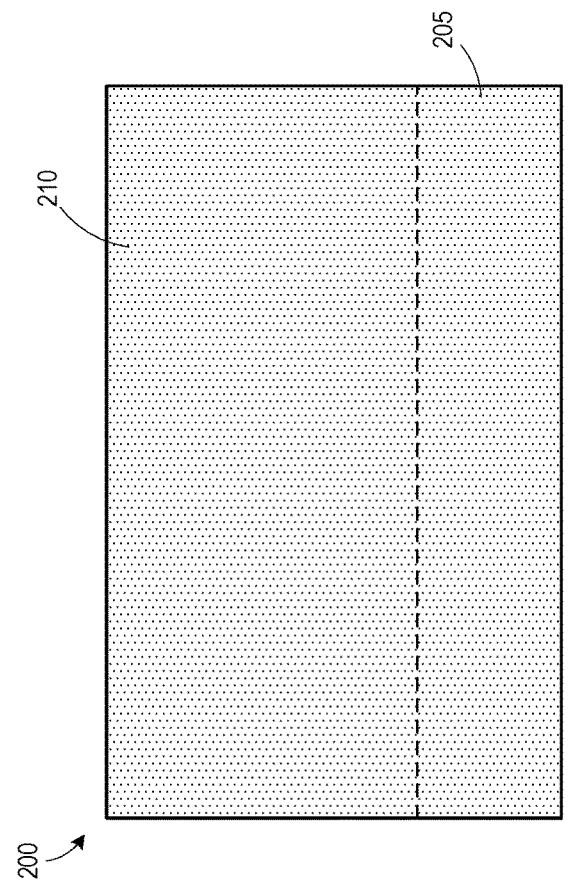
FIGS. 2A-2F and 3A-3F depict various methods disclosed herein of forming a finFET device.
Figure 3B:
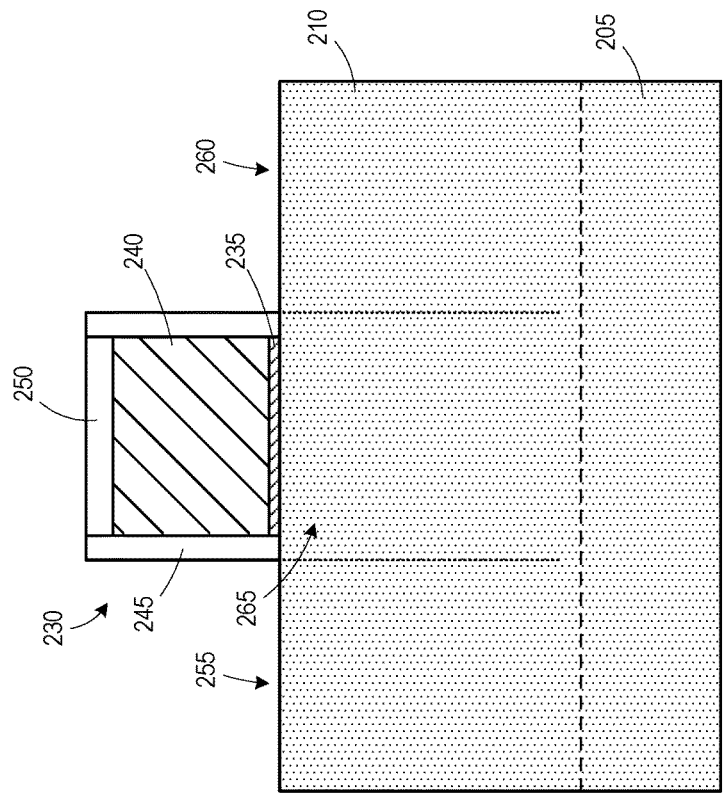
Figure 2B:
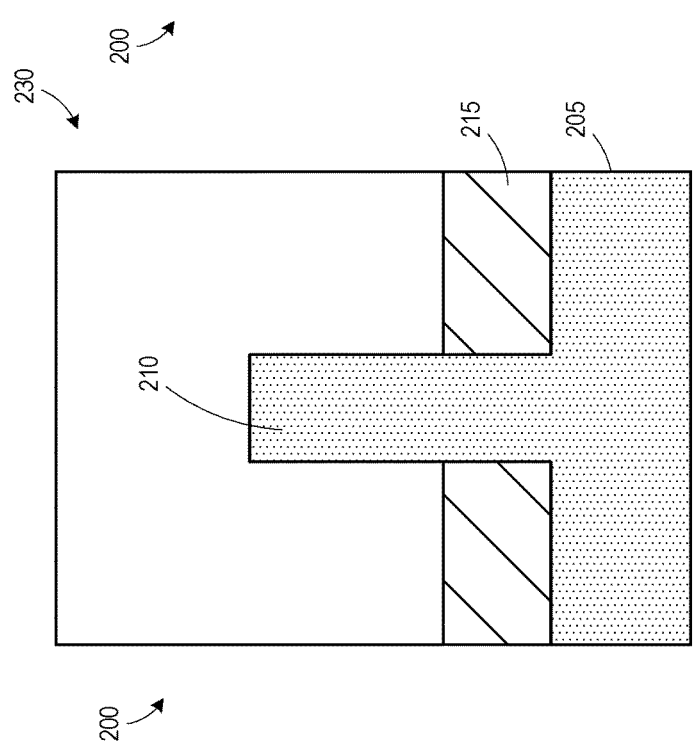

FIGS. 2B and 3B illustrate the device 200 after several processes are performed to form a placeholder (or dummy) gate electrode structure 230 above the fin 210. The placeholder gate electrode structure 230 includes a gate insulation layer 235 (e.g., silicon dioxide interfacial layer and a high-k dielectric material), a placeholder gate electrode 240 (e.g., polysilicon), sidewall spacers 245 (e.g., silicon nitride or silicon oxide) and a cap layer 250 (e.g., silicon nitride). Particular processes for forming the placeholder gate electrode structure 230 are known to those of ordinary skill in the art, so they are not explained in greater detail herein. In the illustrated embodiment, a replacement gate technique (RMG) is used to form the finFET device 200, and the placeholder gate electrode structure 230 is illustrated prior to the formation of a replacement gate structure, where the placeholder gate electrode 240 is typically replaced with a metal gate electrode. The placeholder gate electrode 240 divides the fin into source/drain (SD) regions 255, 260 and a channel region 265 therebetween.

Figure 3C:
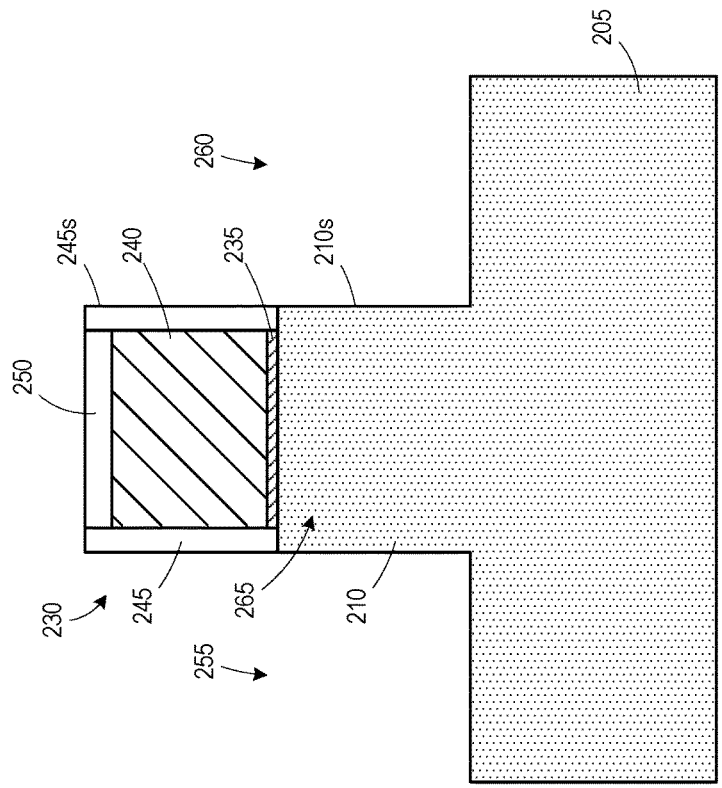
Figure 2C:
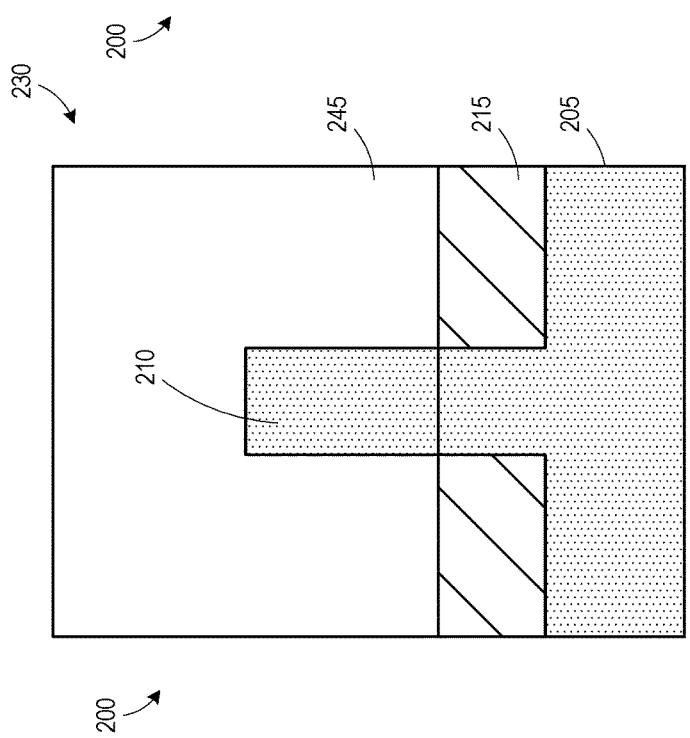

FIGS. 2C and 3C illustrate the device 200 after a silicon etch process is performed to recess the fin 210 by using the spacers 245 and cap layer 250 as an etch mask. As illustrated in FIG. 3C, the fin 210 is recessed to a height even with the isolation region 215. As shown in FIG. 3C, after the fin 210 has been recessed as described above, the sidewalls 210s of the recessed fin 210 may be substantially aligned with the sidewalls 245s of the spacers 245.

Figure 3D:
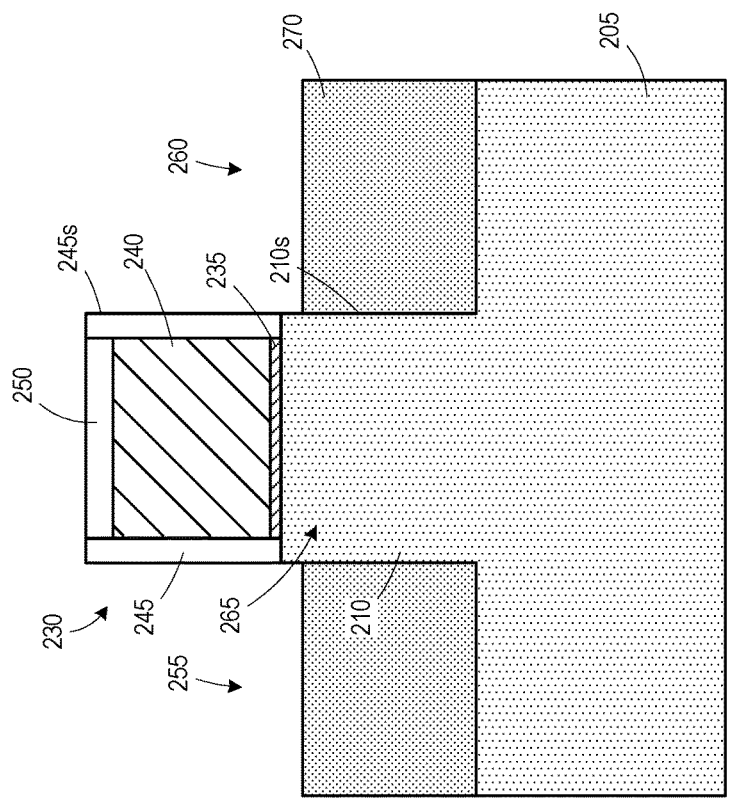
Figure 2D:
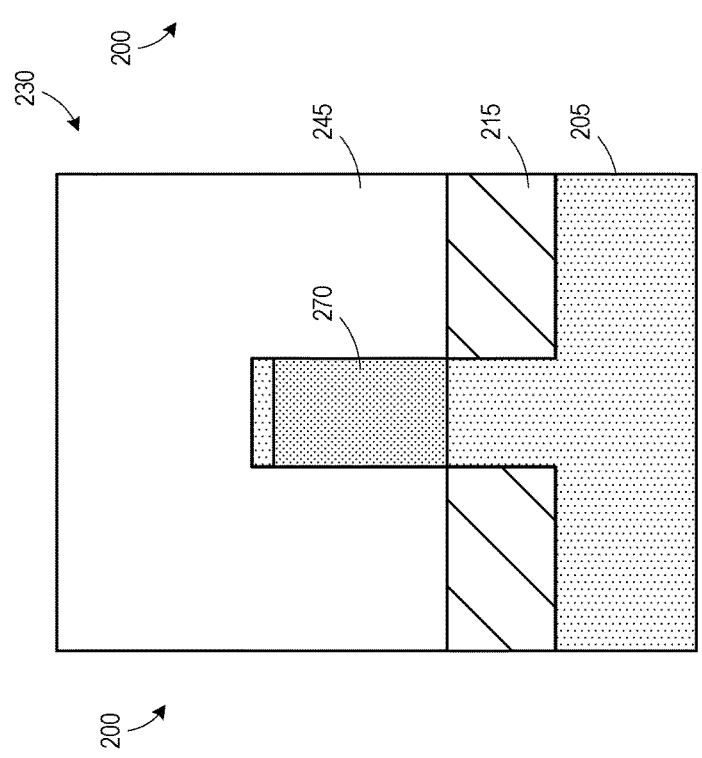

FIGS. 2D and 3D illustrate the device 200 after a first epitaxial region 270 is epitaxially grown at the recessed SD portions of the fin 210. In the illustrated embodiment, the first epitaxial region 270 is epitaxially-grown silicon doped in situ with an N-type dopant, such as phosphorous. In some embodiments, the N-type dopant concentration of the first epitaxial region 270 may be in the range of approximately $1 \times 10^{20}$ to $3 \times 10^{20}$ ions/cm$^3$, with an example value of approximately $1.6 \times 10^{20}$. The thickness of the first epitaxial region 270 may be in the range of approximately 20-45 nm, depending on the particular technology node employed. As device size decreases, a smaller thickness may be employed.

Figure 3E:
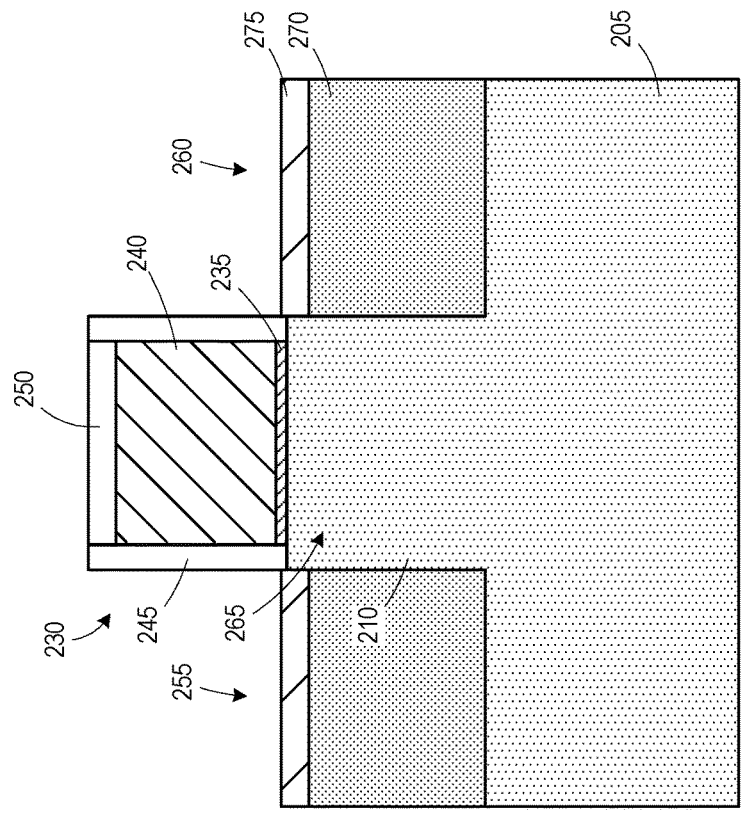
Figure 2E:
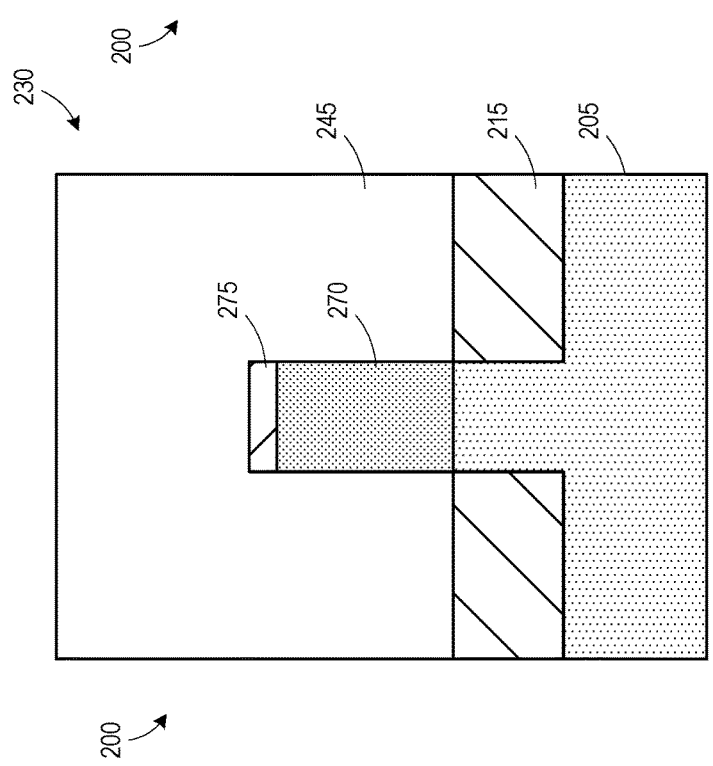

FIGS. 2E and 3E illustrate the device 200 after a diffusion blocking layer 275 is epitaxially grown above the first epitaxial region 270. In some embodiments, the diffusion blocking layer 275 may be a silicon alloy, such as silicon carbon (SiC). In general the diffusion blocking layer 275 is conductive, but blocks diffusion of the N-type dopant in the first epitaxial region 270. In the illustrated embodiment, the diffusion blocking layer 275 is an epitaxially-grown silicon alloy material. In one embodiment, the concentration of the alloy component (e.g., carbon) may be in the range of approximately $1 \times 10^{20}$ to $5 \times 10^{20}$. The diffusion blocking layer 275 may or may not be doped with an N-type dopant, such as phosphorous. The N-type dopant concentration of the diffusion blocking layer 275 may be in the range of approximately 0 to $1 \times 10^{20}$ ions/cm$^3$. The thickness of the diffusion blocking layer 275 may be in the range of approximately 2-8 nm. The diffusion blocking layer 275 has a height that is even with or above the height of the fin 210 in the channel region 265.

Figure 3F:
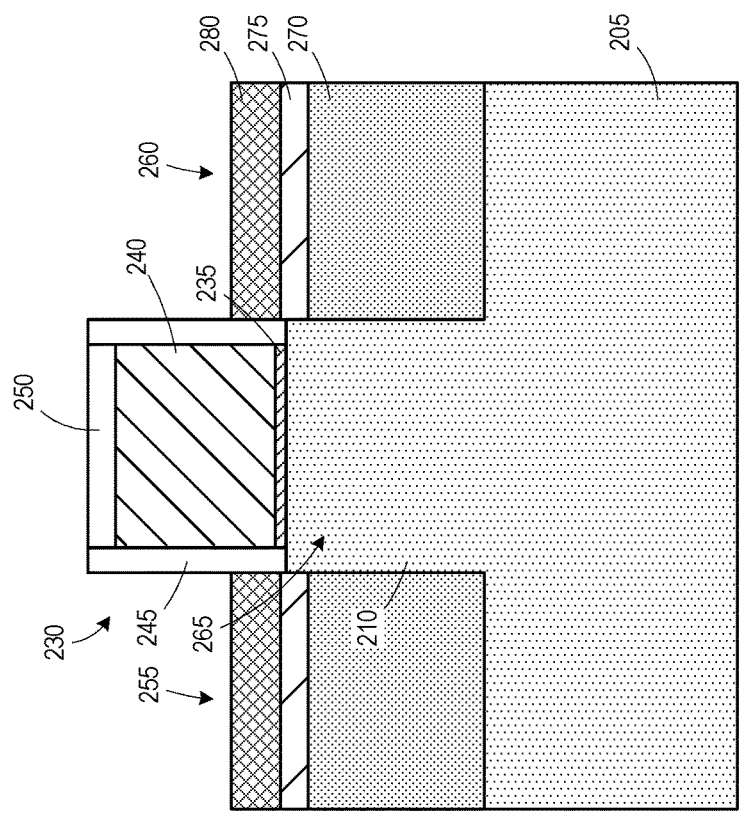
Figure 2F:
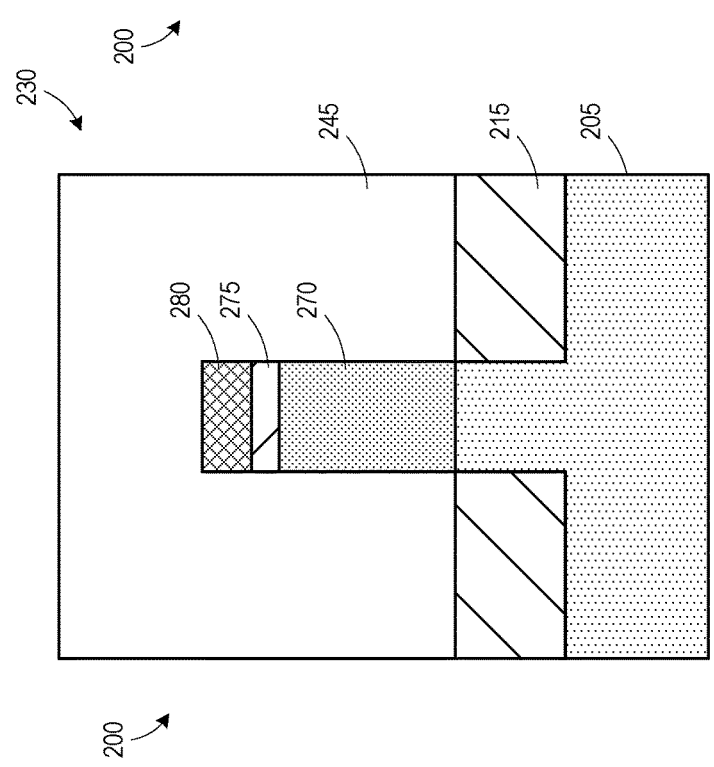

FIGS. 2F and 3F illustrate the device 200 after a second epitaxial region 280 is epitaxially grown above the diffusion blocking layer 275. In the illustrated embodiment, the second epitaxial region 280 is epitaxially-grown silicon doped in situ with an N-type dopant, such as phosphorous. In some embodiments, the N-type dopant concentration of the second epitaxial region 280 may be in the range of approximately $2 \times 10^{20}$ to $1 \times 10^{21}$ ions/cm$^3$, with an example value of approximately $5 \times 10^{20}$. The thickness of the second epitaxial region 280 may be in the range of approximately 5-10 nm, depending on the particular technology node employed.

The first and second epitaxial regions 270, 280 may have a generally rectangular cross-section (as illustrated) or a diamond-shaped cross-section (not shown in the cross-section view through the channel region in FIG. 2F) depending on the crystallographic orientation of the substrate 205.

Additionally, various doped regions, e.g., halo implant regions, well regions and the like, may be formed, but are not depicted in the attached drawings. Additional processing steps may be performed to complete fabrication of the device 200, such as annealing the device 200 to activate dopants, the forming of a replacement gate electrode, the forming of interlayer dielectric materials and contact structures, etc.

The methods described for forming finFET devices 200 herein have numerous advantages. The higher dopant concentration of the second epitaxial region 280 decreases the contact resistance of the device 200, thereby increasing its performance. The diffusion blocking layer 275 inhibits diffusion of N-type dopant from the highly doped second epitaxial region 280 to the first epitaxial region 270. In general, after the dopant activation annealing, the N-type dopant concentration of the diffusion blocking layer 275 will be less than or equal to that of the first epitaxial region 270. Because, the diffusion blocking layer 275 is positioned at or above the height of fin 210 in the channel region 265, the higher dopant level of the second epitaxial region 280 is isolated from the channel region 265, thereby reducing the chance for any short channel effect degradation from higher dopant levels.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a gate electrode structure above a channel region defined in a semiconductor material;
    recessing said semiconductor material in a source/drain region adjacent said channel region;
    epitaxially growing a first material in said source/drain region, wherein said first material comprises a dopant species having a first concentration;
    forming a diffusion blocking layer in said source/drain region above said first material, said diffusion blocking layer comprising an alloy material not present in said first material; and
    epitaxially growing a second material in said source/drain region above said diffusion blocking layer, wherein said second material comprises said dopant species having a second concentration greater than said first concentration and said diffusion blocking layer blocks diffusion of said dopant species from said second material toward said first material.

2. The method of claim 1, wherein said dopant species comprises an N-type dopant species.

3. The method of claim 1, wherein said diffusion blocking layer comprises a silicon alloy layer, and said first and second materials comprise silicon without an alloy component.

4. The method of claim 2, wherein said alloy material comprises carbon.

5. The method of claim 1, wherein said diffusion blocking layer comprises said dopant species having a third concentration less than said second concentration.

6. The method of claim 1, wherein a top surface of said diffusion blocking layer is disposed at a height greater than a height of a top surface of said semiconductor material in said channel region.

7. The method of claim 1, wherein a bottom surface of said second material is disposed at a height greater than a height of a top surface of said semiconductor material in said channel region.

8. A method, comprising:
forming a fin on a semiconductor substrate;
forming a gate electrode structure above said fin in a channel region;
recessing said fin in a source/drain region;
epitaxially growing a first semiconductor material in said source/drain region, wherein said first semiconductor material comprises a dopant species having a first concentration;
epitaxially growing a silicon alloy layer including an alloy species in said source/drain region above said first semiconductor material; and
epitaxially growing a second semiconductor material in said source/drain region above said silicon alloy layer, wherein said second semiconductor material comprises said dopant species having a second concentration greater than said first dopant concentration, wherein said first and second semiconductor materials do not include said alloy species.

9. The method of claim 8, wherein said dopant species comprises an N-type dopant species.

10. The method of claim 8, wherein said alloy species comprises carbon.

11. The method of claim 8, wherein said silicon alloy layer comprises said dopant species having a third concentration less than said second concentration.

12. The method of claim 8, wherein a top surface of said silicon alloy layer is disposed at a height greater than a height of a top surface of said fin in said channel region.

13. The method of claim 8, wherein a bottom surface of said second semiconductor material is disposed at a height greater than a height of a top surface of said fin in said channel region.

14. A method, comprising:
forming a gate electrode structure above a channel region defined in a semiconductor material;
recessing said semiconductor material in a source/drain region adjacent said channel region;
epitaxially growing a first silicon layer in said source/drain region, wherein said first silicon layer comprises a dopant species having a first concentration;
forming a silicon carbon diffusion blocking layer in said source/drain region above said first silicon layer; and
epitaxially growing a second silicon layer in said source/drain region above said silicon carbon diffusion blocking layer, wherein said second silicon layer comprises said dopant species having a second concentration greater than said first concentration, said silicon carbon diffusion blocking layer blocks diffusion of said dopant species from said second silicon layer toward said silicon layer, and said first and second silicon layer do not comprise carbon.

15. The method of claim 14, wherein said dopant species comprises an N-type dopant species.

16. The method of claim 14, wherein said silicon carbon diffusion blocking layer comprises said dopant species having a third concentration less than said second concentration.

17. The method of claim 14, wherein a top surface of said silicon carbon diffusion blocking layer is disposed at a height greater than a height of a top surface of said semiconductor material in said channel region.

18. The method of claim 14, wherein a bottom surface of said second silicon layer is disposed at a height greater than a height of a top surface of said semiconductor material in said channel region.

* * * * *